United States Statutory Invention Registration [19]

[11] Reg. Number: H802

Hisano [43] Published: Jul. 3, 1990

[54] BINARY VOLTAGE LEVEL CONVERTER

[76] Inventor: Shinichi Hisano, 150 Huntington ave., Apt. No. 8, Boston, Mass. 02115

[21] Appl. No.: 335,096

[22] Filed: Apr. 7, 1989

[51] Int. Cl.[5] ..... H03K 19/092

[52] U.S. Cl. ..... 307/475; 307/443; 307/448; 307/451

[58] Field of Search ..... 307/443, 448, 451, 475; 330/288

[56] References Cited

U.S. PATENT DOCUMENTS 4,677,321 6/1987 Bacrania ..... 307/362

*Primary Examiner*—Thomas H. Tarcza
*Assistant Examiner*—Linda J. Wallace
*Attorney, Agent, or Firm*—Ronald J. Kransdorf

[57] ABSTRACT

A circuit is provided for converting binary information received at first logic high and logic low voltage levels from circuitry of a first logic family into logic high and logic low voltage levels for use by circuitry of a second logic family, and more particularly to a TTL to CMOS converter. A reference stage is provided having a temperature stable reference potential source. The reference potential controls the output from the reference stage which is applied as one input to an input stage, the other input to this stage being the input binary voltage levels. The reference stage output controls the input stage to generate a control potential, the level of which changes when the input voltage level passes through a value which is substantially equal to the reference potential. The control potential output from the input stage is connected to an output stage to control the state thereof, the output stage generating an output at the second logic high level when in one state and at the second logic low level when in its other state.

11 Claims, 1 Drawing Sheet

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

BINARY VOLTAGE LEVEL CONVERTER

FIELD OF THE INVENTION

This invention relates to circuits for converting binary information received at first logic high and logic low voltage levels from circuitry of a first logic family to second logic high and logic low voltage levels for use by circuitry of a second logic family, and more particularly to a TTL/CMOS converter.

BACKGROUND OF THE INVENTION

There are many applications where binary information generated by circuitry of a first logic family is to be utilized by circuitry of a second logic family, and where the logic high and logic low voltage levels for circuitry of the two logic families are different. For example, in a multibit digital to analog converter, the input digital information may be generated by TTL logic while the logic for the converter circuit may be CMOS. A TTL to CMOS converter is thus required as a front end to the D/A converter circuit.

A number of voltage level conversion circuits, and in particular TTL to CMOS conversion circuits, currently exist. For example, in its simplest form, the circuit might consist of a CMOS inverter configured such that its switching threshold is at a voltage level roughly midway between the logic high and logic low voltage levels for the logic family providing inputs to the circuit followed by a second output stage inverter. Ideally, this would assure that the output voltage level will always be at the same logic state as the input voltage level. However, in practice, it is difficult to design such circuits so that they provide true outputs over extended temperature ranges, such as the full temperature range provided in military specifications, and over the anticipated specification ranges for the various components and other circuit parameters utilized. Thus, use of such circuitry may require a relaxing of performance specifications which is unacceptable in many applications.

Other circuits for performing the conversion function utilize differential input comparators with threshold levels set by a voltage reference circuit such as two diodes in series. This technique requires the use of bipolar transistors, requires extra bias circuitry for the comparator and diodes and, owing to the use of a comparator, has a relatively long delay time which limits the clock rate at which the circuit may be utilized. Other circuits for performing the conversion function, such as that shown in U.S. Pat. No. 4,791,318, issued Dec. 13, 1988 and assigned to the assignee of this application, involve complicated closed loop control, and thus require a substantial amount of circuitry. These devices are thus relatively expensive.

A need therefore exists for a voltage level conversion circuit, and in particular a TTL/CMOS conversion circuit, which is both simple and inexpensive while still providing high performance over extended temperature ranges and extended variations in component and other circuit parameters. In particular, the circuit should assure that the output logic level always corresponds to the input logic level regardless of temperature and parameter variations, so long as such variations are within relatively wide specifications set for such parameters in the design. Where multibit values are being converted, requiring a multistage converter, it is also desirable that the converter be designed so as to minimize power requirements.

SUMMARY OF THE INVENTION

It is therefore a primary object of this invention to provide an improved logic voltage level conversion circuit which is simple and relatively inexpensive, while providing accurate performance over extended temperature and circuit parameter variations.

A more specific object of this invention is to provide an improved TTL to CMOS conversion circuit of the type indicated above.

Still another object of this invention is to provide a multistage voltage level conversion circuit of the type indicated above with reduced power requirements.

In accordance with the above, this invention provides a circuit for converting binary information received at first logic high and logic low voltage levels from circuitry of a first logic family to second logic high and logic low voltage levels for use by circuitry of a second logic family. The circuit includes an output stage, an input stage and a reference stage. The output stage is operative when in a first state for generating an output at the second logic high voltage level and operative when in a second state for generating an output at the second logic low voltage level. The input stage receives inputs at the first logic levels and generates a control voltage which is applied to the output stage to control its state. The reference stage includes a reference potential source which is substantially stable over an extended temperature range, the voltage level of the reference potential being between the first logic high and logic low voltage levels, and generates an output in response to the reference potential. The input stage is responsive to the reference stage output to change the control voltage to change the state of the output stage when the received input passes through a voltage level which is substantially equal to the reference voltage. In the preferred embodiment, transactions at the input stage occurring at substantially the reference potential are facilitated by the reference stage including a circuit means having a predetermined current flowing therethrough, this current being controlled by the reference potential, and the circuit means being connected to the input stage so that substantially the predetermined current flows through the input stage when the input passes through the substantially equal voltage level. The input stage may include a CMOS inverter having a control transistor connected in series therewith, the control voltage for the output stage being taken from the inverter and the output from the reference stage being connected to control current flow through the control transistor. The source of reference potential may be a voltage divider formed by a pair of series connected resistors, the reference potential appearing at a point between the resistors.

For multibit conversion, a plurality of output stages may be provided, each having a corresponding input stage, with the single reference stage being connected to control each of the plurality of input stages.

For the preferred embodiment, the first logic family is TTL and the second logic family is CMOS, the circuit functioning as a TTL to CMOS converter, and the circuit is formed of CMOS inverters and components.

The foregoing and other objects, features and advantages of the invention will be apparent from the following more particular description of preferred embodiments of the invention as illustrated in the accompanying drawings.

IN THE DRAWINGS:

FIG. 1 is a schematic diagram of a TTL to CMOS converter in accordance with the teachings of this invention FIG. 2 is a schematic diagram of a multibit TTL to CMOS converter constructed in accordance with the teachings of this invention.

DETAILED DESCRIPTION

Figure 1:
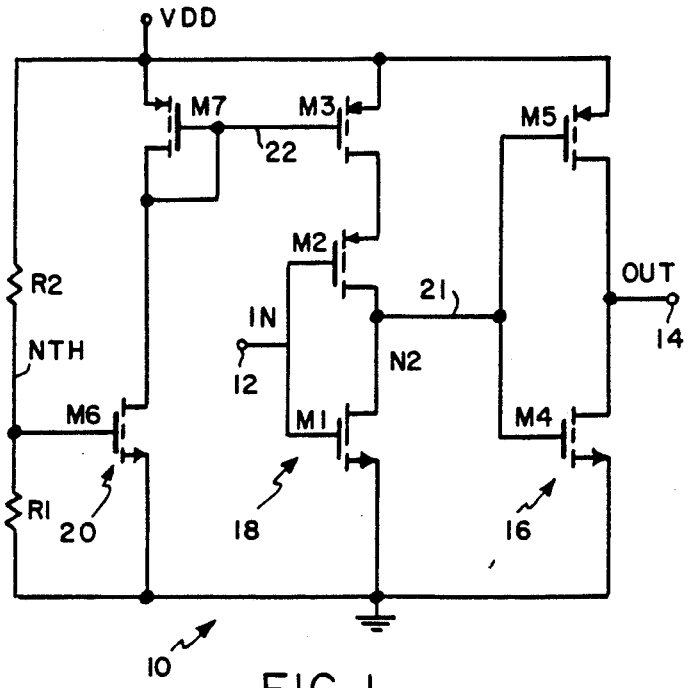

FIG. 1 shows a circuit 10 for converting TTL voltage level inputs received at input terminal 12 into CMOS voltage levels at output terminal 14. In particular, the TTL voltage logic levels are normally a maximum of 0.8 volts for a logic low level and a minimum of 2.0 volts for a logic high level. This contrasts with the CMOS logic levels which are basically ground for logic low and the supply voltage VDD for logic high. Thus, it is desired that the conversion circuit generates a ground output at terminal 14 whenever the voltage level at input terminal 12 is 0.8 volts or less, and that the circuit generates an output at the VDD level from terminal 14 whenever the input received at terminal 12 is 2.0 volts or greater. Since the logic is designed such that the input at terminal 12 will be between 0.8 volts and 2.0 volts only during transitions in logic state, which transitions should be of relatively short duration, the output at terminal 14 during these transition intervals is not critical. Stated another way, transitions in the voltage level at output 14 should occur only when the input voltage level is between 0.8 volts and 2.0 volts (i.e., between the logic low and logic high voltage levels of the TTL circuitry generating inputs to terminal 12) and the output should be at the same logic level as the input when the input is outside this voltage range.

The circuit 10 of FIG. 1 has three stages, an output stage 16, an input stage 18, and a reference stage 20, each of these stages being connected between ground and a source of positive supply potential VDD. Output stage 16 is formed of a standard CMOS inverter formed by a series connected n-channel transistor M4 and p channel transistor M5. Output 14 is taken at the drains of the two series connected transistors. A control input from input stage 18 is applied over line 21 to the gate terminal of each of the transistors M4 and M5.

Input stage 18 is formed of a standard CMOS inverter connected in series with a p channel transistor M3. The inverter is formed of a series connected n channel transistor M1 and p-channel transistor M2. The control output 21 to output stage 16 is taken from node N2 in the input circuit, which node at the drains of the series connected transistors M1 and M2. Input 12 is applied to the gate inputs of transistors M1 and M2. Transistor M3, which is a control transistor for the input stage, receives a gate input over line 22 from reference stage 20.

Reference stage 20 consists of a voltage divider formed by resistances R1 and R2, a drive transistor M6, and a load transistor M7. Resistances R1 and R2 are selected with respect to VDD such that the potential at the node or point NTH between them is substantially equal to the input potential at which switching of the voltage level on output 14 should be occurring. Thus, for the TTL logic voltage levels previously discussed, the values of resistors R1 and R2 might be selected such that the voltage at node NTH is approximately 1.4 to 1.5 volts. The voltage at node NTH is applied to the gate input of drive transistor M6 to permanently bias this transistor in its conducting state. Current flowing through transistor M6 also flows through load transistor M7, and the voltage level at the output from transistor M6 is applied as a gate input to both transistors M3 and M7 to permanently bias these transistors in a conducting state.

In operation, assume initially that the input at terminal 12 from a TTL circuit is in a logic low level (i.e., below 0.8 volts). Under these circumstances, transistor M2 is fully conducting and transistor M1 is conducting very weakly. Since transistor M3 is also fully conducting, this results in the potential at node N2, and thus the potential on line 21, being close to VDD. A high potential on control line 21 causes transistor M4 to be fully conducting and transistor M5 to be cut off, resulting in the desired ground potential at output terminal 14 to the CMOS circuitry.

When the input at terminal 12 undergoes a transition from low to high logic level, the potential at terminal 12 increases from a value under 0.8 volts to a value over 2.0 volts over a short time interval. When this value reaches a value within a few hundred millivolts of the value at node NTH, transistor M1 starts to conduct more strongly, permitting increased current to flow through input stage 18. Thus, depending on circuit parameters, assuming the reference potential at node NTH is approximately 1.4 volts, transistor M1 should start to conduct more strongly when the input voltage level is approximately 1.2 to 1.3 volts.

Because of the way reference stage 20 and input stage 18 are interconnected, when the two stages are in equilibrium, the same current I will flow through both stages. This occurs when transistors M1 and M2 are conducting at substantially equal levels. Because of the substantially identical nature of the two stages, this should occur for an input voltage level substantially equal to that at node NTH.

As the input voltage level increases beyond the equilibrium level, M1 becomes increasingly conductive and M2 becomes increasingly less conductive. When the input level reaches a voltage approximately several hundred millivolts above the equilibrium level (for example something in the 1.5 to 1.6 volt range for the example previously given), transistor M2 reaches a very weakly conducting state, resulting in ground potential appearing at node N2 and being applied to control line 21. This potential on line 21 causes transistor M4 to be cut off and transistor M5 to be fully conducting, resulting in a VDD voltage level at output terminal 14. Thus, the desired logic high voltage level is achieved at output terminal 14 when the input goes high.

When the input level at terminal 12 changes from a logic high to a logic low level, the sequence of operations which occurs is the reverse of the sequence described above. More particularly, transistors M1 and M5 are initially fully conducting, transistor M2 starts to conduct more strongly as the input voltage level drops to within a few hundred millivolts of the equilibrium node NTH voltage level (i.e., approximately 1.5 to 1.6 volts for the examples previously given), transistors M1 and M2 conduct substantially equally when the input is at the reference NTH voltage level, and transistor M1 reaches a very weakly conducting condition while transistor M2 becomes fully conductive as the input drops another few hundred millivolts (i.e., below 1.2 to 1.3 millivolts). When transistor M1 is very weakly conducting and transistor M2 is fully conducting, a high voltage level appears on control line 21 which is effective to cause transistor M4 to conduct and transistor M5 to cut off, resulting in the desired logic low ground voltage level at output terminal 14.

The voltage level at node NTH is substantially constant regardless of changes in temperature, since resistors R1 and R2 will undergo substantially proportional changes with temperature variations, maintaining the voltage division ratio substantially constant. A reference voltage at node NTH which is substantially impervious to temperature variations may also be achieved in other ways such as by using a band gap cell or by other known means.

Similarly, temperature induced variations in transistor M3 will be balanced by a corresponding change in transistor M7 and the same for transistors M1 and M6. Thus, current flow will be maintained substantially the same in the reference and input legs at equilibrium, thus resulting in the equilibrium input voltage remaining substantially close to the fixed reference voltage at node NTH over a wide operating temperature range. This balancing and tendency of the circuit to maintain the equilibrium input voltage substantially equal to the fixed reference voltage at node NTH also functions to assure accurate voltage level outputs from the circuit regardless of relatively wide variations in component and other circuit parameters. For example, with the circuit parameters previously discussed, it has been found that the input threshold levels varied between 1 volt and 1.8 volts (well within the acceptable 0.8 to 2.0 volt range) in spite of (a) threshold voltage variations of $-0.6$ to $-1.2$ volts for the p-channel transistors; (b) threshold voltage variations of 0.6 to 1.2 volts for the n-channel transistors; (c) $\mu_o C_{ox}$ (i.e., mobility and gate unit capacitance) variations for both p-channel and n channel transistors of $\pm 20$ percent; (d) mobility degradation factors $\theta$ for all transistors which also change by $\pm 20$ percent; (e) changes in VDD of $\pm 10$ percent; and (f) changes in temperature over the full military specification range. The sensitivity of the circuit to variations in circuit parameters can be further reduced by selecting M3 and VDD such that VDD is high enough to saturate M3. Under these conditions, the threshold voltage depends exclusively on the voltage at the node NTH, which in turn depends only on the value of VDD and the ratio of resistors R1 and R2.

Figure 2:
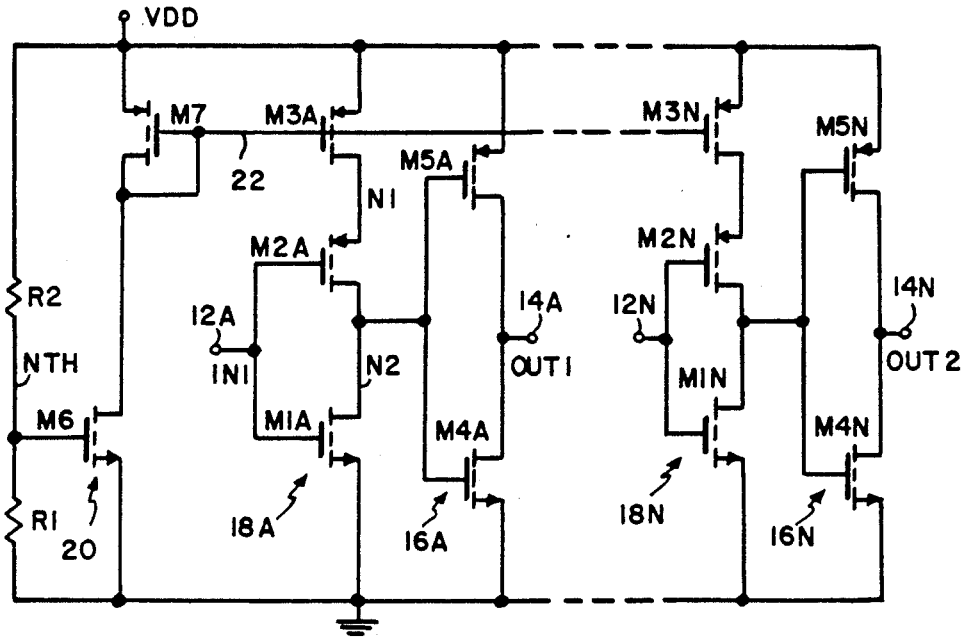

FIG. 2 shows a circuit which may be used where a multibit TTL input is to be converted to a multibit CMOS output. In FIG. 2 a single reference stage 20 having a control output line 22 is utilized to control transistor M3A–M3N or a plurality of input stages 18A–18N respectively Each input stage 18A–18N has a corresponding output stage 16A 16N. Each of the circuits shown in FIG. 2 functions in the same way as the corresponding circuits shown in FIG. 1. The circuit of FIG. 2 is advantageous in that the reference stage, being the only one of the stages which constantly draws significant current, is the largest power drain in the circuit. Thus, by sharing a single reference stage 20 among a plurality of input and output stages, the overall power requirements of the circuit for multibit operation are substantially reduced.

A relatively simple and inexpensive voltage level conversion circuit is thus provided which is capable of providing accurate results over wide variations in operating temperatures and circuit parameters. For the preferred embodiment, the circuit is implemented utilizing CMOS technology; however, it is apparent that the circuit could be implemented utilizing other standard circuit technology. Thus, while the invention has been particularly shown and described above with reference to preferred embodiments, the foregoing and other changes in form and detail may be made therein by one skilled in the art without departing from the spirit and scope of the invention.

What is claimed is:

1. A circuit for converting binary information received at first logic high and logic low voltage levels from circuitry of a first logic family to second logic high and logic low voltage levels for use by circuitry of a second logic family comprising:

an output stage operative when in a first state for generating an output at said second logic high voltage level and operative when in a second state for generating an output at said second logic low voltage level;

an input stage for receiving inputs at said first logic levels and for generating a control voltage, said control voltage being applied to the output stage to control its state; and a reference stage including means for generating a reference potential substantially stable over an extended temperature range, the level of said reference potential being between said first logic high and logic low voltage levels, and means responsive to said reference potential for generating an output; said input stage including control means responsive to said reference stage output for changing said control voltage to change the state of said output stage when the received input passes through a voltage level which is substantially equal to said reference voltage.

2. A circuit as claimed in claim 1 wherein said reference stage includes circuit means having a predetermined current flowing therethrough; and wherein said control means includes means for causing substantially said predetermined current to flow through said input stage when said input passes through said substantially equal voltage level.

3. A circuit as claimed in claim 1 wherein said input stage includes an inverter having an n channel and a p-channel transistor connected in series, said received input being applied to the gate inputs of said transistors, and said control voltage being taken from the connected drains of the transistors, and a control transistor connected in series with said inverter, the output from the reference stage being connected to control the current flow through said control transistor.

4. A circuit as claimed in claim 3 wherein said reference stage includes circuit means operative in response to said reference potential for having a predetermined current flowing therethrough; and wherein said control means includes means for causing substantially said predetermined current to flow through said series connected input stage transistors when said input passes through said substantially equal voltage level.

5. A circuit as claimed in claim 1 wherein said reference potential generating means includes a voltage divider formed by at least two series connected resistor means, said reference potential being obtained at a node between said resistor means.

6. A circuit as claimed in claim 1 including a plurality of said output stages; and a like plurality of input stages, there being an input stage generating a control voltage for each output stage; and wherein the output from said reference stage is connected to control each of said plurality of input stages.

7. A circuit as claimed in claim 1 wherein said output stage includes a CMOS inverter having a p-channel and an n channel transistor connected in series.

8. A circuit as claimed in claim 7 wherein said input stage includes a CMOS inverter connected in series with a CMOS control transistor.

9. A circuit as claimed in claim 8 wherein said reference stage includes a voltage divider formed from at least two series connected resistor means, said reference potential appearing at a node between the resistors, and a drive transistor biased to a conducting state by said reference potential, the output from said drive transistor being applied to said control transistor to control current flow therethrough.

10. A circuit as claimed in claim 1 wherein said first logic family is TTL and said second logic family is CMOS, said circuit functioning as a TTL to CMOS converter.

11. A circuit for converting binary information received at first logic high and logic low voltage levels from circuitry of a first logic family to second logic high and logic low voltage levels for use by circuitry of a second logic family comprising:

an output node;

sources of said second logic high and logic low voltage levels;

switching means operative when in one state for connecting said second logic high voltage source to said output node and operative when in a second state for connecting said second logic low voltage source to said output node;

means for generating a reference voltage which is substantially stable over an extended temperature range, said reference voltage being at a selected value between said first logic high and logic low voltage levels; and means for generating a voltage to control the state of said switching means, said means being responsive to the reference voltage to change the control voltage when the received voltage passes through a value substantially equal to said reference voltage.

* * * * *